United States Patent
Yin et al.

(10) Patent No.: US 9,723,766 B2
(45) Date of Patent: Aug. 1, 2017

(54) POWER SUPPLY MODULE WITH ELECTROMAGNETIC-INTERFERENCE (EMI) SHIELDING, COOLING, OR BOTH SHIELDING AND COOLING, ALONG TWO OR MORE SIDES

(75) Inventors: Jian Yin, San Jose, CA (US); Nikhil Vishwanath Kelkar, Saratoga, CA (US); Michael Althar, Melbourne, FL (US)

(73) Assignee: INTERSIL AMERICAS LLC, Milpitas, CA (US)

( * ) Notice: Subject to any disclaimer, the term of this patent is extended or adjusted under 35 U.S.C. 154(b) by 909 days.

(21) Appl. No.: 13/035,792

(22) Filed: Feb. 25, 2011

(65) Prior Publication Data

US 2012/0063038 A1    Mar. 15, 2012

Related U.S. Application Data

(60) Provisional application No. 61/381,636, filed on Sep. 10, 2010.

(51) Int. Cl.
*H01L 23/552* (2006.01)
*H05K 9/00* (2006.01)

(52) U.S. Cl.
CPC .. *H05K 9/0007* (2013.01); *H01L 2224/40095* (2013.01); *H01L 2224/48091* (2013.01); *Y10T 29/49002* (2015.01)

(58) Field of Classification Search
CPC ............ H05K 9/0007; Y10T 29/49002; H01L 2224/48091

(Continued)

(56) References Cited

U.S. PATENT DOCUMENTS 5,220,489 A    6/1993  Barreto et al.
5,621,635 A    4/1997  Takiar
(Continued)

FOREIGN PATENT DOCUMENTS

CN    1674276        9/2005
CN    102254908      11/2011
(Continued)

OTHER PUBLICATIONS

U.S. Appl. No. 13/042,332, entitled "Molded Power-Supply Module With Bridge Inductor Over Other Components", filed Mar. 7, 2011, pp. 23.

(Continued)

*Primary Examiner* — Julia Slutsker
*Assistant Examiner* — Krista Soderholm
(74) *Attorney, Agent, or Firm* — Foley & Lardner LLP; Mark J. Danielson

(57) ABSTRACT

An embodiment of a power-supply module includes a package having sides, a first power-supply component disposed in the package, and an electromagnetic-interference (EMI) shield disposed adjacent to two sides of the package. For example, such a module may include component-mounting platforms (e.g., a lead frame or printed circuit board) on the top and bottom sides of the module, and these platforms may provide a level of EMI shielding specified for a particular application. Consequently, such a module may provide better EMI shielding than modules with shielding along only one side (e.g., the bottom) of the module. Moreover, if the module components are mounted to, or otherwise thermally coupled to, the shielding platforms, then the module may provide multi-side cooling of the components.

45 Claims, 5 Drawing Sheets

(58) Field of Classification Search
USPC ........ 257/660, 659, 422, E23.114, 666, 691, 257/797
See application file for complete search history.

(56) References Cited

U.S. PATENT DOCUMENTS

| | | | |
|---|---|---|---|
| 5,757,074 | A | 5/1998 | Matloubian et al. |
| 6,049,469 | A * | 4/2000 | Hood et al. ............... 361/818 |
| 6,274,937 | B1 | 8/2001 | Ahn et al. |
| 6,541,948 | B1 | 4/2003 | Wong |
| 6,885,278 | B2 | 4/2005 | Nakao et al. |
| 6,972,965 | B2 | 12/2005 | Ravid et al. |
| 7,087,976 | B2 | 8/2006 | Gardner |
| 7,166,493 | B2 | 1/2007 | Dentry et al. |
| 7,327,010 | B2 | 2/2008 | Gardner |
| 7,439,452 | B2 | 10/2008 | Masuda |
| 7,531,893 | B2 | 5/2009 | Koduri |
| 7,615,842 | B2 | 11/2009 | Lee et al. |
| 7,636,242 | B2 | 12/2009 | Hazucha et al. |
| 7,714,419 | B2 * | 5/2010 | Camacho et al. ............ 257/670 |
| 7,808,087 | B2 * | 10/2010 | Zhao et al. ............... 257/670 |
| 8,064,211 | B2 | 11/2011 | Furukawa et al. |
| 8,213,180 | B2 * | 7/2012 | Zhao et al. ............... 361/720 |
| 8,264,059 | B2 * | 9/2012 | Kim et al. ............... 257/508 |
| 2002/0017699 | A1 | 2/2002 | Shenoy |
| 2003/0031339 | A1 | 2/2003 | Marshall et al. |
| 2003/0209785 | A1 | 11/2003 | Choi et al. |
| 2004/0089955 | A1 | 5/2004 | Zhou |
| 2004/0178473 | A1 | 9/2004 | Dentry et al. |
| 2005/0007178 | A1 | 1/2005 | Fahim |
| 2005/0189636 | A1 | 9/2005 | Savastiouk et al. |
| 2006/0018098 | A1 | 1/2006 | Hill et al. |
| 2006/0102994 | A1 | 5/2006 | Pu et al. |
| 2006/0108663 | A1 | 5/2006 | Sanzo et al. |
| 2007/0072340 | A1 | 3/2007 | Sanzo et al. |
| 2007/0090502 | A1 | 4/2007 | Zhao et al. |
| 2007/0114634 | A1 | 5/2007 | Lin et al. |
| 2007/0114651 | A1 | 5/2007 | Marimuthu et al. |
| 2007/0138594 | A1 | 6/2007 | Lee et al. |
| 2007/0152796 | A1 | 7/2007 | He et al. |
| 2007/0290362 | A1 | 12/2007 | Hsu et al. |
| 2008/0029907 | A1 | 2/2008 | Koduri |
| 2008/0036034 | A1 | 2/2008 | Juskey et al. |
| 2008/0180921 | A1 | 7/2008 | Chen et al. |
| 2008/0297138 | A1 | 12/2008 | Taylor et al. |
| 2008/0303125 | A1 | 12/2008 | Chen et al. |
| 2009/0032927 | A1 | 2/2009 | Kim et al. |
| 2009/0127691 | A1 * | 5/2009 | Lee ............... 257/691 |
| 2009/0134856 | A1 | 5/2009 | Rahman et al. |
| 2009/0160595 | A1 | 6/2009 | Feng et al. |
| 2009/0166822 | A1 | 7/2009 | Camacho et al. |
| 2009/0186453 | A1 | 7/2009 | Koduri |
| 2009/0207574 | A1 | 8/2009 | Chen et al. |
| 2009/0230519 | A1 * | 9/2009 | Otremba et al. ............ 257/666 |
| 2010/0117243 | A1 | 5/2010 | Zaccardi |
| 2010/0133670 | A1 | 6/2010 | Liu et al. |
| 2010/0155836 | A1 | 6/2010 | Herbert |
| 2010/0155837 | A1 | 6/2010 | Herbert |
| 2010/0155915 | A1 | 6/2010 | Bell et al. |
| 2010/0276752 | A1 | 11/2010 | Herbert |
| 2011/0049693 | A1 * | 3/2011 | Nakashiba et al. ........... 257/676 |
| 2011/0057106 | A1 * | 3/2011 | Kimura et al. ............ 250/338.3 |
| 2011/0228507 | A1 | 9/2011 | Yin et al. |
| 2012/0273932 | A1 * | 11/2012 | Mao et al. ............... 257/676 |

FOREIGN PATENT DOCUMENTS

| | | |
|---|---|---|
| CN | 102447382 | 5/2012 |
| JP | 2004063676 | 2/2004 |
| JP | 2004289912 | 10/2004 |
| JP | 2005123535 | 5/2005 |
| JP | 2007318954 | 12/2007 |
| JP | 2008017540 | 1/2008 |
| JP | 2008060426 | 3/2008 |
| JP | 2009038950 | 2/2009 |
| JP | 2010056463 | 3/2010 |
| JP | 2010129877 | 6/2010 |
| JP | 2011193000 | 9/2011 |
| JP | 2015122507 | 7/2015 |
| KR | 100275541 | 1/2001 |
| KR | 100662848 | 12/2006 |
| TW | 201205767 | 2/2012 |
| TW | 201230294 | 7/2012 |
| WO | 03/021667 | 3/2003 |
| WO | 2008/003008 | 1/2008 |
| WO | 2008/011459 A2 | 1/2008 |
| WO | 2008/011459 A3 | 1/2008 |
| WO | 2009/067265 | 5/2009 |

OTHER PUBLICATIONS

State Intellectual Property Office, P.R.C., "Third Office Action from Chinese application No. 201110285670.9", Mar. 4, 2016, pp. 1-10, Published in: CN.
United States Patent and Trademark Office, "Advisory Action", "from U.S. Appl, No. 13/042,332", Sep. 16, 2016, pp. 1-3, Published in: US.
Japan Patent Office, "Final Office Action for JP Patent Application No. 2014-265316", "from Foreign Counterpart of U.S. Appl. No. 13/042,332", Aug. 9, 2016, pp. 1-2, Published in: JP.
State Intellectual Property Office of the People's Republic of China, "Office Action for CN patent Application No. 201110285670.9", "from Foreign Counterpart of U.S. Appl. No. 13/035,792", Sep. 5, 2016, pp. 1-8, Published in: CN.
US Patent Office, "Advisory Action", "from U.S. Appl. No. 13/042,332", May 19, 2014, pp. 1-3, Published in: US.
US Patent Office, "Advisory Action", "from U.S. Appl. No. 13/042,332", Apr. 30, 2015, pp. 1-7, Published in: US.
US Patent Office, "Advisory Action", "from U.S. Appl. No. 13/042,332", Sep. 16, 2016, pp. 1-4, Published in: US.
US Patent Office, "Advisory Action", "from U.S. Appl. No. 13/042,332", Sep. 22, 2016, pp. 1-4, Published in: US.
US Patent Office, "Final Office Action", "from U.S. Appl. No. 13/042,332", Feb. 5, 2015, pp. 1-26, Published in: US.
US Patent Office, "Final Office Action", "from U.S. Appl. No. 13/042,332", Feb. 20, 2014, pp. 1-32, Published in: US.
US Patent Office, "Final Office Action", "from U.S. Appl. No. 13/042,332", May 20, 2016, pp. 1-26, Published in: US.
US Patent Office, "Office Action", "from U.S. Appl. No. 13/042,332", May 20, 2013, pp. 1-28, Published in: US.
US Patent Office, "Office Action", "from U.S. Appl. No. 13/042,332", Aug. 1, 2014, pp. 1-24, Published in: US.
US Patent Office, "Office Action", "from U.S. Appl. No. 13/042,332", Sep. 24, 2015, pp. 1-31, Published in: US.

* cited by examiner

POWER SUPPLY MODULE WITH ELECTROMAGNETIC-INTERFERENCE (EMI) SHIELDING, COOLING, OR BOTH SHIELDING AND COOLING, ALONG TWO OR MORE SIDES

CLAIM OF PRIORITY

The present application claims the benefit of U.S. Provisional Patent Application Ser. No. 61/381,636 filed on Sep. 10, 2010; which application is incorporated herein by reference in its entirety.

RELATED APPLICATION DATA

This application is related to U.S. patent application Ser. No. 13/042,332 entitled MOLDED POWER-SUPPLY MODULE WITH BRIDGE INDUCTOR OVER OTHER COMPONENTS filed on Mar. 7, 2011.

SUMMARY

An embodiment of a power-supply module includes a package having first and second sides, a first power-supply component mounted along the first side of the package, and a second power-supply component mounted along the second side of the package. For example, such a module may include a first component mounted to the top of the package and a second component mounted to the bottom of the package such that the primary cooling path for the first component is through the package top and the primary cooling path for the second component is through the package bottom. Consequently, such a module may provide improved cooling of its internal components as compared to modules with stacked components or with components mounted along only one side of the package.

Another embodiment of a power-supply module includes a package having sides, a first power-supply component disposed in the package, and an electromagnetic-interference (EMI) shield disposed adjacent to two sides of the package. For example, such a module may include component-mounting platforms (e.g., lead frame or printed circuit board) on the top and bottom sides of the module, and these platforms may provide a level of EMI shielding specified for a particular application. Consequently, such a module may provide better EMI shielding than modules with shielding along only one side (e.g., the bottom) of the module. Moreover, if the module components are mounted to, or otherwise thermally coupled to, the shielded platforms, then the module may provide multi-side cooling as described in the preceding paragraph.

DETAILED DESCRIPTION

Figure 1:
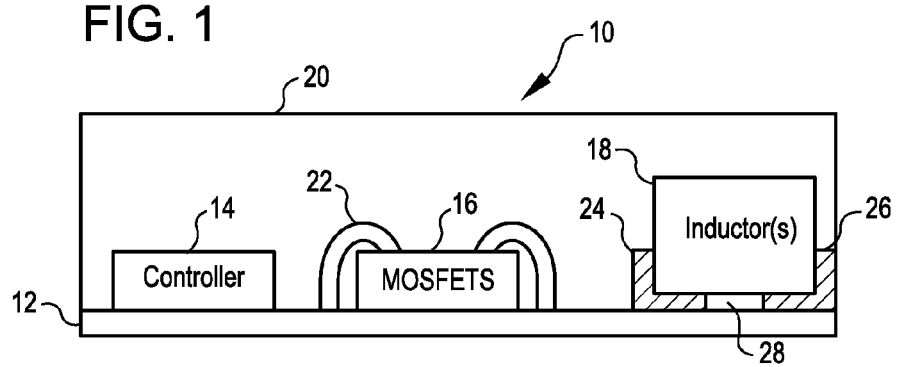
FIG. 1 is a cutaway side view of a power-supply module having a single level of components and EMI shielding and cooling only along one side of the module.

One or more embodiments are described with reference to the drawings, wherein like reference numerals may be used to refer to like elements throughout. In the following description, for purposes of explanation, numerous specific details are set forth in order to provide a thorough understanding of the one or more embodiments. It may be evident, however, that one or more embodiments may be practiced without these specific details. In other instances, well-known structures and devices are shown in block diagram form in order to facilitate describing one or more embodiments.

FIG. 1 is a cutaway side view of a switching-power-supply module 10, which may be used to power an integrated circuit or other device (not shown in FIG. 1), and which may include most or all of the power-supply components such that few, if any, discrete components of the power supply need be mounted to a printed circuit board (not shown in FIG. 1) to which the module is mounted. This may save board space and reduce assembly complexity and cost for the manufacturer of a system in which the module 10 is incorporated.

The power-supply module 10 includes a platform 12, a controller 14 mounted to the platform, MOSFET transistors 16 mounted to the platform, one or more inductors 18 mounted to the platform, and a package 20 that encapsulates the controller, transistors, and inductor(s).

The platform 12 may be a printed circuit board or a lead frame, and thus may provide EMI shielding along the bottom side of the module 10.

The controller 14 may be any suitable power-supply controller, or other controller adapted or programmed to control a power supply. Leads or pads (not shown) beneath the controller 14 may electrically couple the controller to the platform 12. Or, the controller 14 may include top leads or pads that are wire bonded to the platform 12. The controller may also include both underneath pads/leads and top pads/leads. Furthermore, the controller 14 may be in contact with the platform 12, or there may be a thermally conductive substance (e.g., a thermally conductive grease) between the controller and the platform, to facilitate heat transfer from the controller to the platform so as to facilitate the cooling of the controller via the platform.

The transistors 16 may include high-side and low-side switching transistors for driving the one or more phases of the power supply. For example, the module 10 may include two transistors 16, a high-side transistor and a low-side transistor, for each phase. Furthermore, the transistors 16 may be in contact with the platform 12, or there may be a thermally conductive substance between the transistors and the platform, to facilitate heat transfer from the transistors to the platform so as to facilitate the cooling of the transistors. The transistors 16 may have pads on the bottom for electrical contact to the platform 12, or the transistors may have pads on the top that are wire bonded to the platform with wires 22. The transistors 16 may also include both underneath pads/leads and top pads/leads.

The one or more inductors 18 may include the power-supply-phase inductor(s), and an optional filter inductor. The inductor(s) 18 may be packaged in an inductor module, or may be unpackaged. Leads 24 and 26, which may be made from a suitably conductive material such as copper or aluminum, may electrically and thermally couple the inductor(s) 18 to the platform 12 to keep the inductor(s) cool. Furthermore, a thermally conductive material may be disposed in a space 28 between the inductor(s) 18 and the platform 12.

The package 20 may be formed from any suitable material such as an epoxy resin, may completely cover the controller 14, transistors 16, and inductor(s) 18, and may completely cover the platform 12, or may leave portions of the platform exposed, for example, the bottom portion of the platform having pads or leads that allow external electrical connections to the controller, transistors, and inductor(s). Furthermore, the package 20 may be solid such that it fills in most to all unoccupied spaces (e.g., spaces within the boundaries of the package unoccupied by the controller 14, transistors 15, inductor(s) 18, and other power-supply components) so that there are few or no voids within the module.

A problem with the module 10, however, is that it has EMI shielding only along the bottom side of the module. For example, the platform 12 may be made from a shielding material such as metal (e.g., if the platform is a lead frame), or may include a shielding material (e.g., a ground plane if the platform is a circuit board). But the module 10 includes nothing to block EMI from radiating through the top side and side walls of the module.

Another problem with the module 10 is that it has a relatively inefficient layout, because there is a significant amount of unoccupied space (e.g., above the controller 14 and transistors 16) within the package 20.

Figure 2:
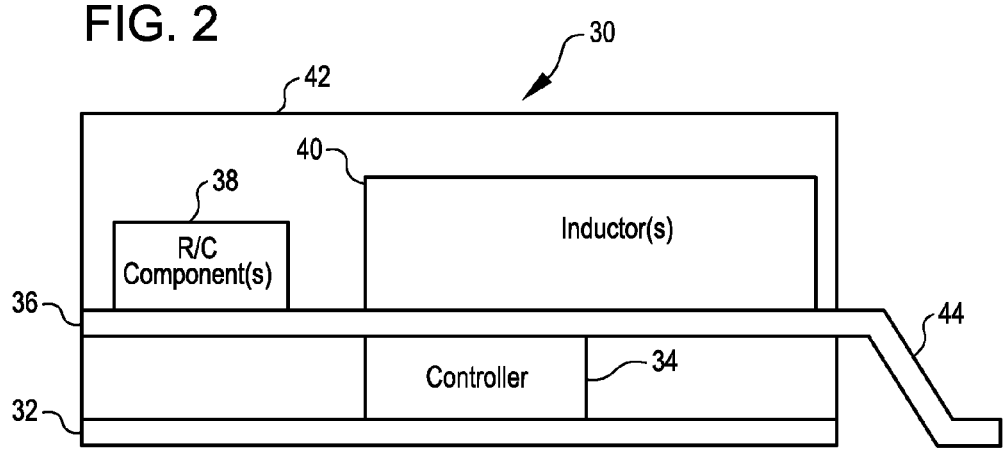
FIG. 2 is a cutaway side view of a power-supply module having stacked (multiple levels of) components and EMI shielding and cooling only along one side of the module.

FIG. 2 is a cutaway side view of a switching-power-supply module 30, which may be used to power an integrated circuit or other device (not shown in FIG. 2), and which may, like the module 10 of FIG. 1, include most or all of the power-supply components such that few, if any, discrete components of the power supply need be mounted to a printed circuit board (not shown in FIG. 2) to which the module is mounted.

The power-supply module 30 includes a platform 32, a controller 34 mounted to the platform, a lead frame 36 disposed over the platform, one or more resistor/capacitor (R/C) components 38 mounted to the lead frame, one or more inductors 40 mounted to the lead frame, and a package 42 that encapsulates the controller, lead frame, transistors, and inductor(s). The transistors (e.g., MOSFETS) used to drive the one or more inductors 40 may be integrated on the same die or in the same package as the controller 34; alternatively, although not shown, if the transistors are separate from the controller, then the transistors may be mounted to the platform 32, for example, adjacent to the controller.

The platform 32 may be similar to the platform 12 of FIG. 1, and thus may be a printed circuit board or a lead frame, and may provide EMI shielding along the bottom side of the module.

The controller 34 may be similar to the controller 14 of FIG. 1, and thus may be any suitable power-supply controller, or other controller adapted or programmed to control a power supply. Leads or pads (not shown) beneath the controller 34 may electrically couple the controller to the platform 32, and leads or pads (not shown) above the controller may electrically couple the controller to the lead frame 36. Furthermore, the controller 34 may be in contact with the platform 32 and the lead frame 36, or there may be a thermally conductive substance between the controller and the platform and between the controller and the lead frame, to facilitate heat transfer from the controller to the platform and to the lead frame so as to facilitate cooling of the controller.

The lead frame 36 is mounted over the platform 32 to provide another surface to which components (e.g., the transistors 38 and inductor(s) 40) may be mounted within the module 30. The lead frame 36 may be made from metal or another suitable material, and may include one or more leads 44 that extend outside of the package for contacting a printed circuit board (not shown in FIG. 2) to which the module 30 is mounted.

The R/C component(s) 38 may include, e.g., one or more feedback resistors or capacitors and one or more signal-value-setting or trimming resistors or capacitors. For example, a resistor may be used to set an over-current value at which the module 30 enters an over-current-protection mode. Furthermore, the R/C component(s) 38 may have pads facing the lead frame 36, and these pads may be coupled to pads on the lead frame. Moreover, the R/C component(s) 38 may be in contact with the lead frame 36, or a thermally conductive material may be disposed between the R/C component(s) and the lead frame, to facilitate heat transfer from the R/C component(s) to the lead frame.

The one or more inductors 40 may be similar to the one or more inductors 18 of FIG. 1, and may have bottom pads or leads that electrically couple the inductor(s) to the lead frame 36. Furthermore, the inductor(s) may be in contact with the lead frame 36, or a thermally conductive material may be disposed between the inductor(s) 40 and the lead frame.

The package 42, which may be similar to the package 20 of FIG. 1, may be formed from any suitable material such as an epoxy resin, may completely cover the controller 34, R/C component(s) 38, and inductor(s) 40, and may completely cover the platform 32 and lead frame 36, or may leave portions of the platform and lead frame exposed, for example, the bottom portion of the platform having pads or leads, and the one or more leads 44 of the lead frame.

A problem with the module 30, however, is that it may have inadequate EMI shielding for all of the components. Although the platform 32 and the lead frame 36 may shield the controller 34 and other components (not shown in FIG. 2) mounted on the platform from two sides, the R/C component(s) 38, inductor(s) 40, and any other components mounted to the lead frame 36 are shielded from only one side (the bottom) by the lead frame. In applications where the inductors(s) 40 and transistors 38 radiate significant EMI, then such single-sided shielding may be inadequate.

Another problem with the module 30 is that it may not provide adequate cooling of some of its components. For example, a major heat-transfer path for components (e.g., the transistors 38 and the inductor(s) 40) mounted to the lead frame 36 is through the lead(s) 44; therefore, this path may be relatively long and provide inadequate cooling for these components. Furthermore, there may be no exposed pads or other exposed metal on the top of the module 30, and this may significantly limit the amount of component cooling that can occur through the top of the module.

Still another problem with the module 30 is that it is relatively inefficient because it provides relatively high-resistance electrical connections to some of its components. For example, the electrical connections between the printed circuit board (not shown) to which the module 30 is mounted and the components (e.g., the transistors 38 and the inductor(s) 40) mounted to the lead frame 36 may be through the lead(s) 44; therefore, these paths may have relatively high resistances because they are relatively long. And the power losses through these high-resistance paths may significantly reduce the power-conversion efficiency of the module 30. Furthermore, where such a long path forms part of a feedback loop, it may cause the loop to pick up a significant amount of noise, and thus may adversely impact the performance of the module 30.

Figure 3:
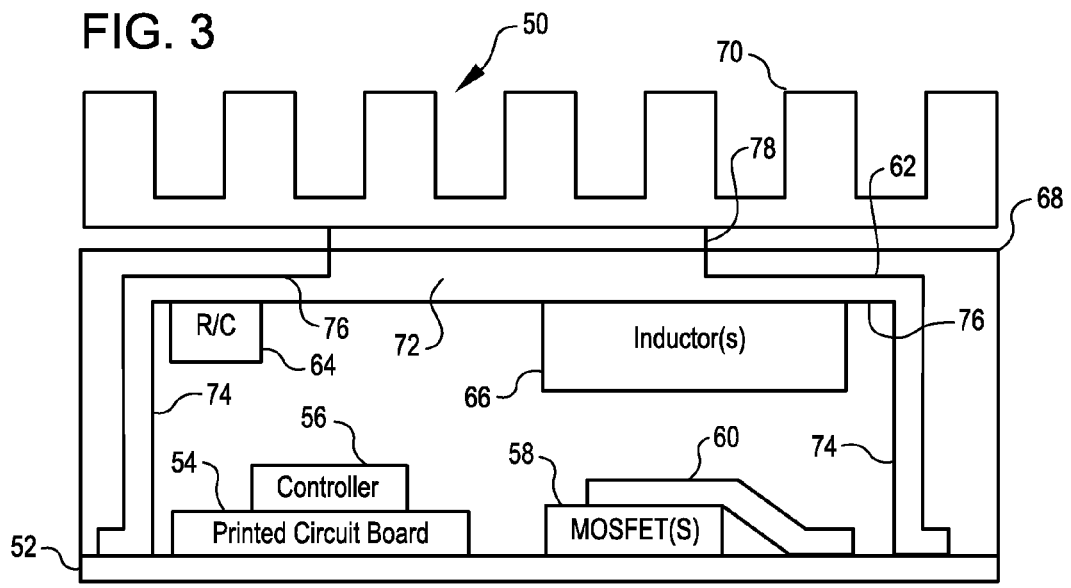
FIG. 3 is a cutaway side view of an embodiment of a power-supply module with multi-side EMI shielding and cooling.

FIG. 3 is a cutaway side view of an embodiment of a switching-power-supply module 50, which may have improved EMI shielding, component cooling, and space-utilization efficiency as compared to the modules 10 and 30 of FIGS. 1 and 2.

The power-supply module 50 includes a platform 52, a printed circuit board 54 mounted to the platform, a controller 56 mounted to the circuit board, MOSFET transistors 58 mounted to the platform, one or more clips 60 that electrically couple the transistors to the platform, a lead frame 62 mounted to the platform, one or more resistor/capacitor (R/C) components 64 mounted to an underside of the lead frame at the top of the module, one or more inductors 66 also mounted to the underside of the lead frame, a package 68, and a heat sink 70 mounted to an exposed portion 72 of the lead frame.

As discussed below, the platform 52 and lead frame 62 may provide EMI shielding on at least two sides (e.g., bottom and top) of the module 50, thus reducing the overall EMI radiated by the module.

And, as discussed below, because the internal components (e.g., controller 56, MOSFETS 58, R/C components 64, and inductor(s) 66) are mounted on multiple sides (e.g., top and bottom) of the module 50, cooling of these components occurs through at least two sides (e.g., top and bottom) of the module, thus increasing the overall cooling efficiency of the module. Furthermore, mounting components on multiple sides of the module 50 may efficiently utilize the space in the module, thus potentially reducing or minimizing the size of the module for a given application.

The platform 52 may be similar to the platforms 12 and 32 of FIGS. 1 and 2, and thus may be a printed circuit board, a lead frame, or any other suitable platform, and may provide EMI shielding along the bottom side of the module 50.

The controller 56 may be similar to the controllers 14 and 34 of FIGS. 1 and 2, and leads or pads (not shown) beneath the controller may electrically couple the controller to the platform 52 via the circuit board 54. Furthermore, the controller 56 may be in contact with the circuit board 54, or there may be a thermally conductive substance between the controller and the circuit board, and between the circuit board and the platform 52, to facilitate heat transfer from the controller to the platform, and thus to facilitate cooling of the controller.

The transistors 58 may be similar to the transistors 16 of FIG. 1, and may be in contact with the platform 52, or there may be a thermally conductive substance between the transistors and the platform to facilitate heat transfer from the transistors to the platform, and to thus facilitate cooling of the transistors. Furthermore, the transistors 58 may have bottom conductive pads coupled to pads on the platform 52, and may have top pads that are coupled to pads on the platform via the clip(s) 60. For example, the transistors 58 may be electrically coupled to the inductor(s) 66 via the clip(s) 60, platform 52, and lead(s) 74. Moreover, where the transistors 58 include high-side and low-side transistors, these transistors may be disposed on a single die and in a single package as disclosed in the following references, which are incorporated by reference: U.S. patent application Ser. Nos. 12/471,911, "Single Die Output Power Stage Using Trench-Gate Low-Side and LDMOS High-Side MOSFETS, Structure, And Method," filed May 26, 2009; Ser. No. 12/470,229, "Co-Packaging Approach For Power Converters Based On Planar Devices, Structure And Method," filed May 21, 2009; and Ser. No. 12/477,818, "Stacked Power Converter Structure And Method," filed Jun. 3, 2009.

The clip(s) 60 may be made from any suitable material such as copper, and, in addition to electrically coupling top pads of the transistors 58 to the platform 52, the clip(s) may also provide a heat-transfer path between the transistors and the platform to facilitate cooling of the transistors. And because the clip(s) 60 may be thicker than conventional bonding wires, each clip may reduce the resistance of the respective signal path that the clip forms.

The lead frame 62 may be made of any suitable material such as metal, and includes one or more leads 74 that support the lead frame over the platform 52 and that provide electrical and thermal coupling between the lead frame and platform. The exposed portion 72 of the lead frame 62 may be formed to project above an adjacent top portion 76 of the lead frame, or the top portion may be etched back to form the projecting exposed portion. Furthermore, the exposed portion 72 and top portion 76 of the lead frame 62 may act as a voltage or ground plane for the module 50.

The R/C component(s) 64 may be similar to the R/C component(s) 38 of FIG. 2, and may include, e.g., one or more feedback resistors or capacitors and one or more signal-value-setting or trimming resistors or capacitors. For example, a resistor may be used to set an over-current value at which the module 50 enters an over-current-protection mode. Furthermore, the R/C component(s) 64 may have pads facing the lead frame 62, and these pads may be coupled to pads on the lead frame. Furthermore, the R/C component(s) 64 may be in contact with the lead frame 62, or a thermally conductive material may be disposed between the R/C component(s) and the lead frame, facilitate cooling of the R/C component(s) via the lead frame.

The one or more inductors 66 may be similar to the one or more inductors 18 and 40 of FIGS. 1 and 2, and may have bottom pads or leads that electrically couple the inductor(s) to the lead frame 62. Furthermore, the inductor(s) 66 may be in contact with the lead frame 62, or a thermally conductive material may be disposed between the inductor(s) and the lead frame, to facilitate cooling of the inductor(s) via the lead frame.

The package 68, which may be similar to the packages 20 and 42 of FIGS. 1 and 2, may be formed from any suitable material such as an epoxy resin, may completely cover the controller 56, transistors 58, R/C component(s) 64, inductor(s) 66, may cover all portions of the lead frame 62 but for the exposed portion 72, and may completely cover the platform 52 or may leave portions of the platform exposed, for example, the bottom portion of the platform having pads or leads.

The heat sink 70 may be made from any suitable material such as a metal, and may be in contact with the exposed portion 72 of the lead frame 62, or a thermally and electrically conductive material 78 may be disposed between the heat sink and the exposed portion.

During operation of the module 50, the platform 52 and lead frame 62 may impede EMI from radiating outside of the module on at least two sides (e.g., bottom and top) of the module. Furthermore, if the lead frame 62 has multiple leads 74, then the pitch of the leads may be small enough to impede EMI from radiating through the one or more sides of the module on which the leads are disposed. Moreover, where the height of the module 50 is relatively small (e.g., much smaller than its width and length), then the areas of the module sides are relatively small such that only a relatively small amount of the total EMI generated by the module radiates through the sides; consequently, even if the lead(s) 74 provide(s) little or no shielding, the shielding at the top and bottom of the module may prevent most of the module-generated EMI from radiating from the module. In addition, the heat sink 70 may also act to impede EMI from radiating from the top of the module 50.

Also during operation of the module 50, the platform 52 and the lead frame 62 facilitate cooling of the module's internal components through at least two sides (e.g., bottom and top) of the module. For example, heat generated by the controller 56 and transistors 58 may be dissipated primarily through the platform 52, and heat generated by the R/C component(s) 64 and inductor(s) 66 may be dissipated primarily through the lead frame 62 and heat sink 70. Furthermore at least some of the heat generated by the controller 56 and transistors 58 may flow through the platform 52 and lead(s) 74 also to be dissipated through the lead frame 62 and the heat sink 70, and at least some of the heat generated by the R/C component(s) 64 and inductor(s) 66 may flow through the lead frame 62 and the lead(s) 74 also to be dissipated through the platform 52.

Still referring to FIG. 3, alternate embodiments of the module 50 are contemplated. For example, the heat sink 70, and any one or more of the components within the module 50, may be omitted. Furthermore, the module 50 may include one or more other components that are not shown in FIG. 3. Moreover, components shown mounted to the platform 52 may be mounted to the lead frame 62, and vice-versa. In addition, one or more of the leads 74 may extend outside of the package 68 for electrical connection to a printed circuit board on which the module 50 may be mounted. Furthermore, any of the components in the module 50 other than, or in addition to, the transistors 58 may be electrically coupled to the platform 52 or lead frame 62 via wire bonds or clips such as the clip(s) 60. Moreover, the platform 52 or printed circuit board 54 may be a BT substrate, which is made from a material that may withstand higher temperatures than a printed circuit board; therefore, a BT substrate may be made thinner than a printed circuit board for a given application. In addition, although disclosed as MOSFET transistors, the transistors 58 may be bipolar transistors or any other suitable type of transistor.

Figure 4:
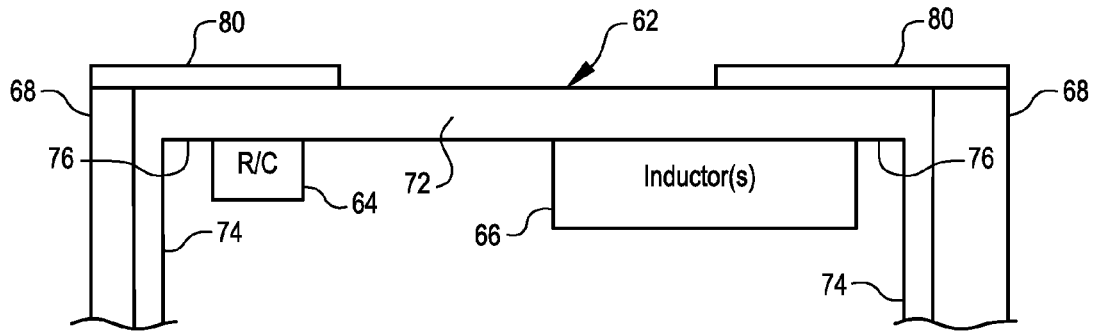
FIG. 4 is a cutaway side view of an embodiment of an alternate top for the power-supply module of FIG. 3.

FIG. 4 is a cutaway side view of an alternate embodiment of the top portion of the switching-power-supply module 50 of FIG. 3 (the heat sink 70 and thermally conductive material 78 of FIG. 3 are omitted from FIG. 4).

Instead of the exposed portion 72 being formed to project beyond the top portion 76, or the top portion 76 being etched back relative to the exposed portion 72, the exposed and top portions 72 and 78 are approximately coplanar (i.e., the top of the lead frame 62 is approximately level) and the top portion 76 is covered with an electrically insulating material such as a solder mask 80.

Alternatively, the top portion 76 of the lead frame 62 may be covered by a portion of the package 68.

Such an embodiment may save costs by allowing the lead frame 62 to be manufactured with an approximately flat top surface.

Figure 5:
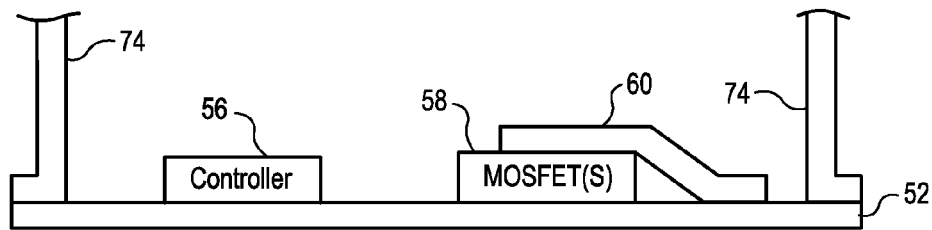
FIG. 5 is a cutaway side view of an embodiment of an alternate bottom for the power-supply module of FIG. 3.

FIG. 5 is a cutaway side view of an alternate embodiment of the bottom portion of the switching-power-supply module 50 of FIG. 3.

Instead of being mounted to the printed circuit board 54, the controller 56 is mounted to the platform 52 (or with a thermally conductive material between the controller and platform) and the printed circuit board is omitted.

Omitting the printed circuit board may reduce the component count of the module 50 and the assembly complexity and cost of the module, and may also improve the cooling of the controller 56 by shortening the heat-transfer path between the controller and the platform 52.

Figure 6:
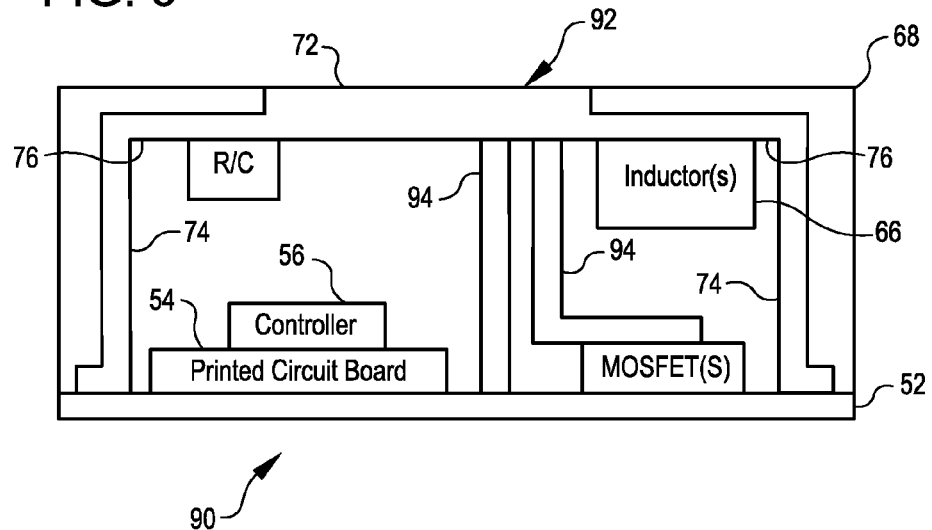
FIG. 6 is a cutaway side view of another embodiment of a power-supply module with multi-side EMI shielding and cooling.

FIG. 6 is a cutaway side view of an embodiment of a switching-power-supply module 90, which may have improved EMI shielding, component cooling, and space-utilization efficiency as compared to the modules 10 and 30 of FIGS. 1 and 2.

The module 90 may be similar to the module 50 of FIG. 3, except that the module 90 includes a lead frame 92 having one or more inner-module leads 94 in addition to, or instead of, the one or more side leads 74.

The inner lead(s) 94 may provide support of the lead frame 92 over the platform 52 in addition to the support provided by the side lead(s) 74 (if present).

Furthermore, the inner lead(s) 94 may shorten the electrical paths between components mounted to the platform 52 and components mounted to the lead frame 92. For example, one or more inner leads 94 may shorten respective electrical paths between the transistors 58 and the inductor(s) 66 as compared to a corresponding electrical path in the module 50 of FIG. 3 from a transistor, through the clip 60, platform 52, and side lead 74, to an inductor. Such shortened electrical paths may exhibit reduced resistance, and may thus reduce power losses during operation of the module 90. Furthermore, where such a shortened electrical path forms part of a feedback loop, it may reduce noise coupling, and thus may improve the module's response time and other performance characteristics.

Moreover, the inner lead(s) 94 may improve the cooling of the module 90 by providing one or more additional heat-transfer paths between the platform 52 and lead frame 92, and one or more additional heat-transfer paths for components (e.g., the transistors 58) within the module.

Still referring to FIG. 6, alternate embodiments of the module 90 are contemplated. For example, one or more of the alternate embodiments discussed above in conjunction with FIGS. 3-5 for the module 50 may be applicable to the module 90.

Figure 7:
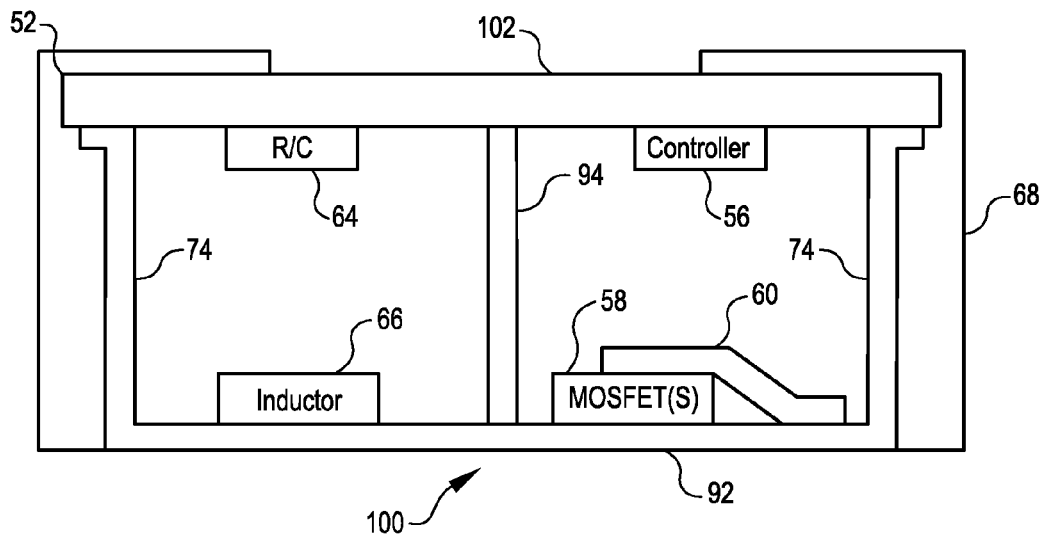
FIG. 7 is a cutaway side view of another embodiment of a power-supply module with multi-side EMI shielding and cooling.

FIG. 7 is a cutaway side view of an embodiment of a switching-power-supply module 100, which may have improved EMI shielding, component cooling, and space-utilization efficiency as compared to the modules 10 and 30 of FIGS. 1 and 2.

The module 100 may be similar to the module 90 of FIG. 6, except that the lead(s) 74 of the lead frame 92 support the platform 52 over the lead frame, and the transistors 58 are mounted to the lead frame and the R/C component(s) 64 are mounted to the platform such that the components that have fewer electrical connections and generate more heat are mounted to the lead frame, and the components that have more electrical connections and generate less heat are mounted to the platform 52.

If the module 100 includes a heat sink such as the heat sink 70 of FIG. 3, then the heat sink may be mounted directly to an exposed portion 102 of the platform 52, or a thermally conductive material may be disposed between the heat sink and the exposed portion of the platform. The exposed portion 102 of the platform 52 may be formed as discussed above in conjunction with FIG. 3 or FIG. 4.

Furthermore, the package 68 may not cover at least a portion of the bottom of the lead frame 92 so that the lead frame may make electrical connections with a printed circuit board (not shown in FIG. 7) to which the module 100 is mounted.

Still referring to FIG. 7, alternate embodiments of the module 100 are contemplated. For example, one or more of the alternate embodiments discussed above in conjunction with FIGS. 3-6 may be applicable to the module 100. Furthermore, wherein the platform 52 is a printed circuit board, then the entire top side of the board may be exposed such that the package 68 (or any other electrical insulator) need not cover any portion of the top side of the printed circuit board.

Figure 8A:
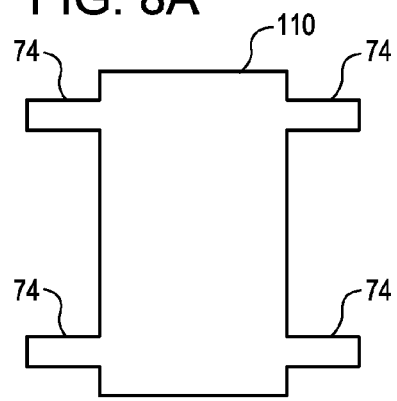
FIG. 8A is a plan view of an embodiment of a lead frame suitable for one of the top and bottom side of a power-supply module.

FIG. 8A is a plan view of an embodiment of a lead frame 110 that may be used at the bottom or top of a power-supply module where the leads 74 extend externally out from the package for electrical connection to the printed circuit board to which the module is mounted. The leads 74 may be bent as appropriate during manufacture of the module. Furthermore, although the lead frame 110 may also include one or more inner-module leads 94 that may be bent as appropriate during manufacture of the modules, these one or more inner-module leads are omitted from FIG. 8A.

Figure 8B:
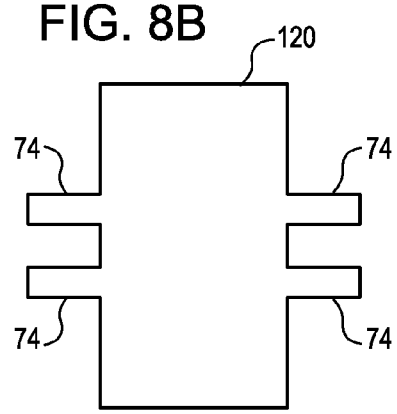
FIG. 8B is a plan view of an embodiment of a lead frame suitable for the other of the top and bottom side of a power-supply module.

FIG. 8B is a plan view of an embodiment of a lead frame 120 that may be used for whichever of the bottom or top of a module that the lead frame 110 of FIG. 8A is not used. The leads 74 may be bent as appropriate during manufacture of the module. Furthermore, although the lead frame 120 may also include one or more inner-module leads 94 that may be bent as appropriate during manufacture of the module, these one or more inner-module leads are omitted from FIG. 8B.

Figure 8C:
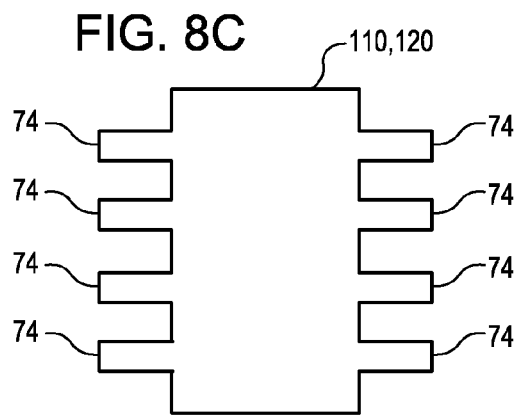
FIG. 8C is a plan view of the lead frames of FIGS. 8A and 8B overlaying one another as they would when installed in a power-supply module.

FIG. 8C is a plan view of the lead frames 110 and 120 of FIGS. 8A and 8B overlaid on one another; as shown, the leads 74 of these two lead frames are positioned such that they do not overlap or otherwise interfere with one another, and thus form the "pin out" of the module.

Still referring to FIGS. 8A-8C, alternate embodiments of the lead frames 110 and 120 are contemplated. For example, one or both of the frames 110 and 120 may include one or more leads 74 that may be bent in such a way that they do not extend externally from the package of the module, and that instead support one lead frame over the other lead frame in a manner similar to that shown in FIGS. 3, 6, and 7. Or, one or more inner-module leads 94 may be used to support one lead frame over the other in a manner similar to that shown in FIGS. 5, 6, and 7. For example, the lead frames 110 and 120 may be used as the lead frame and platform of the modules 30, 50, 90, and 100 of FIGS. 3-7. In such an embodiment, the leads 74 may be bent so that they do not extend out through the package, and one lead frame maybe made slightly larger than the other to facilitate the lead(s) 74 (or the lead(s) 94) of the smaller frame resting against the larger frame such that the lead(s) support(s) one of the frames over the other frame in a manner similar to that shown in FIGS. 3-7.

Figure 9A:
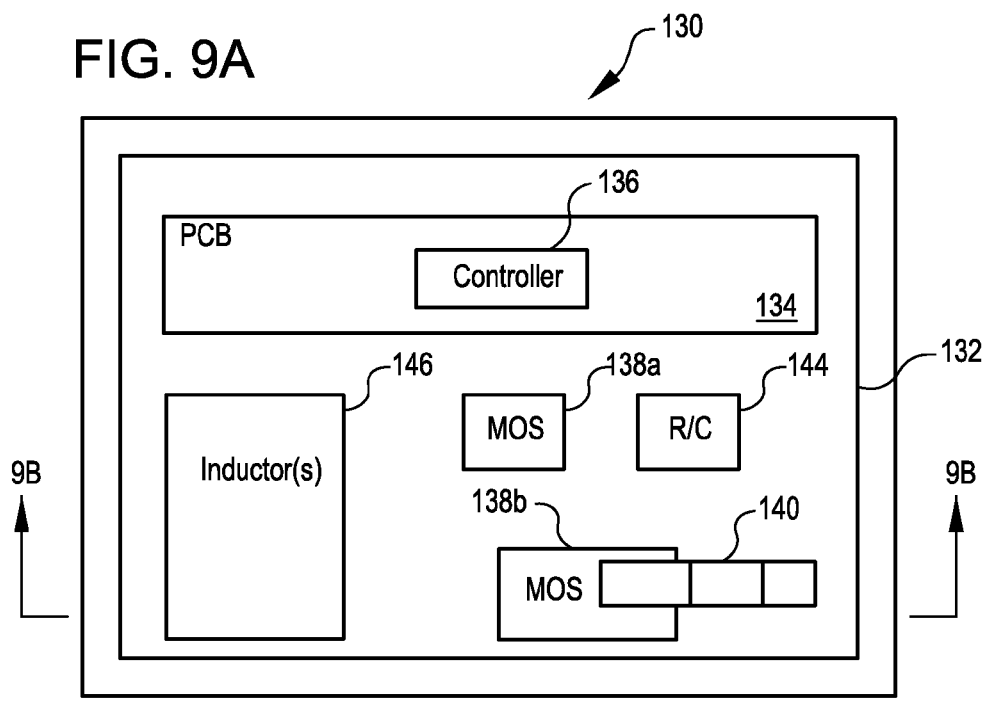
FIG. 9A is a plan view of an embodiment of a power-supply module with multi-side EMI shielding and multi-side cooling.

FIG. 9A is a cutaway plan view of an embodiment of a switching-power-supply module 130, which may have improved EMI shielding, component cooling, and space-utilization efficiency as compared to the modules 10 and 30 of FIGS. 1 and 2.

Figure 9B:
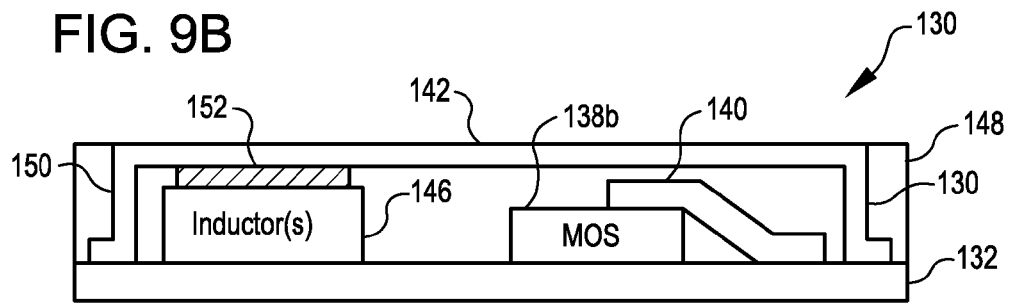
FIG. 9B is a cutaway side view of the power-supply module of FIG. 9A.

FIG. 9B is a cutaway side view of the module 130 along line A-A of FIG. 9A.

The power-supply module 130 includes a platform 132, a printed circuit board 134 mounted to the platform, a controller 136 mounted to the circuit board, MOSFET transistors 138a and 138b mounted to the platform, one or more clips 140 that electrically couple one or more of the transistors to the platform, a lead frame 142 mounted to a portion of the platform, one or more resistor/capacitor (R/C) components 144 mounted to the platform, one or more inductors 146 mounted to the platform, and a package 148.

As discussed below, the platform 132 and lead frame 142 may provide EMI shielding on at least two sides (e.g., bottom and top) of the module 130, thus reducing the overall EMI radiated by the module.

And, as discussed below, because at least the inductor(s) 146 is(are) thermally coupled to the platform 132 and the lead frame 142, the cooling of at least the inductor(s) occur(s) through at least two sides (e.g., top and bottom) of the module 130, thus increasing the overall cooling efficiency of the module.

The platform 132 may be similar to the platforms 12, 32, and 52 of FIGS. 1, 2, and 3 respectively, and thus may be a printed circuit board, a lead frame, or any other suitable platform, and may provide EMI shielding along the bottom side of the module 130.

The controller 136 may be similar to the controllers 14, 34, and 56 of FIGS. 1, 2, and 3, respectively, and leads or pads (not shown) beneath the controller may electrically couple the controller to the platform 132 via the circuit board 134. Furthermore, the controller 136 may be in contact with the circuit board 134, which may be in contact with the platform 132, or there may be a thermally conductive substance between the controller and the circuit board and between the circuit board and the platform to facilitate heat transfer from the controller to the platform.

The transistors 138a and 138b may be similar to the transistors 16 and 58 of FIGS. 1 and 3 and may be in contact with the platform 132, or there may be a thermally conductive substance between the transistors and the platform to facilitate heat transfer from the transistors to the platform. Furthermore, the transistors 138 may have bottom conductive pads coupled to pads on the platform 52, and may have top pads that are coupled to pads on the platform via the clip(s) 140 (only one clip 140 for the transistor 138b is shown in FIGS. 9A-9B). Moreover, the transistor 138a may be a high-side transistor and the transistor 138b may be a low-side transistor, and the high-side transistor may be smaller than the low-side transistor because the low-side transistor may often conduct a higher average current during operation of the module 130.

The clip(s) 140 may be similar to the clips 60 of FIG. 3, and thus may be made from any suitable material such as copper, and, in addition to electrically coupling top pads of the transistors 138 to the platform 132, the clip(s) may also provide a heat-transfer path between the transistors and the platform to facilitate cooling of the transistors. Because the clip(s) 140 may be thicker than conventional bonding wires, each clip may reduce the resistance of the respective signal path that the clip forms as compared to a bonding wire.

The lead frame 142 may be made of any suitable material such as metal, and includes one or more leads 150 that support the lead frame over the platform 132. For example, the lead frame 142 may be disposed over the high-EMI-radiating components such as the transistors 138, R/C component(s) 144, and inductor(s) 146, but not disposed over the controller 136 to save cost. Where the lead frame 142 acts as a ground or other voltage plane, then it may be left exposed at the top of the module 130 to facilitate cooling of the module. A heat sink (not shown in FIGS. 9A-9B) may be attached to the exposed portion of the lead frame 142 to further facilitate cooling of the module 130.

The R/C component(s) 144 may be similar to the R/C components 38 and 64 of FIGS. 2-3, and thus may include, e.g., one or more feedback resistors or capacitors and one or more signal-value-set or trimming resistors or capacitors. The R/C component(s) 144 may have pads facing the platform 132, and these pads may be coupled to pads on the platform. Furthermore, the R/C component(s) 144 may be in contact with the platform 132, or a thermally conductive material may be disposed between the R/C component(s) and the platform.

The one or more inductors 146 may be similar to the one or more inductors 18, 40, and 66 of FIGS. 1, 2, and 3, and may have bottom pads or leads that electrically couple the inductor(s) to the platform 132. Furthermore, the inductor(s) 146 may be in contact with the platform 132, or a thermally conductive material may be disposed between the inductor(s) and the platform. Moreover, the inductor(s) 146 may be in contact with the lead frame 142, or a thermally conductive material 152 may be disposed between the inductor(s) and the lead frame to further facilitate cooling of the inductor(s) and the module 130. The inductor(s) 146 may also have top pads or leads that electrically couple the inductor(s) to the lead frame 142.

The package 148, which may be similar to the packages 20, 42, and 68 of FIGS. 1, 2, and 3, may be formed from any suitable material such as an epoxy resin, may completely cover the controller 136, transistors 138, R/C component(s) 144, inductor(s) 146, may cover all portions of the lead frame 142 or may leave a top portion of the lead frame exposed per above, and may completely cover the platform 132 or may leave portions of the platform exposed, for example, the bottom portion of the platform having pads or leads.

During operation of the module 130, the platform 132 and lead frame 142 may impede EMI from radiating outside of the module on at least two sides (e.g., the bottom and top) of the module. Furthermore, if the lead frame 142 has multiple leads 150, then the pitch of the leads may be small enough to impede EMI from radiating through the one or more sides of the module on which these leads are disposed. Moreover, where the height of the module 130 is relatively small (e.g., much smaller than its width and length), then the areas of the module sides are relatively small such that only a relatively small amount of the total EMI generated by the module radiates through the sides; consequently, even if the lead(s) 150 provide(s) little or no shielding, the shielding at the top and bottom of the module may prevent most of the module-generated EMI from radiating from the module.

Also during operation of the module 130, the platform 132 and the lead frame 142 facilitate cooling of the module's internal components through at least two sides (e.g., the bottom and top) of the module. For example, heat generated by the controller 136, transistors 138, and R/C component(s) 144 may be dissipated through the platform 132, and heat generated by the inductor(s) 146 may be dissipated through the both the platform and the lead frame 142.

Still referring to FIGS. 9A and 9B, alternate embodiments of the module 130 are contemplated. For example, any embodiments discussed above in conjunction FIGS. 3-8 may be applicable to the module 130. Furthermore, the printed circuit board 134 may be omitted such that the controller 136 is mounted to the platform 132; such omission may reduce the component count, cost, and assembly complexity of the module 130, and shorten the heat-transfer path from the controller to the platform. Furthermore, although not shown in FIGS. 9A 9B, the lead frame 149 may include inner-module leads such as the leads 94 of FIGS. 6-7.

Figure 10:
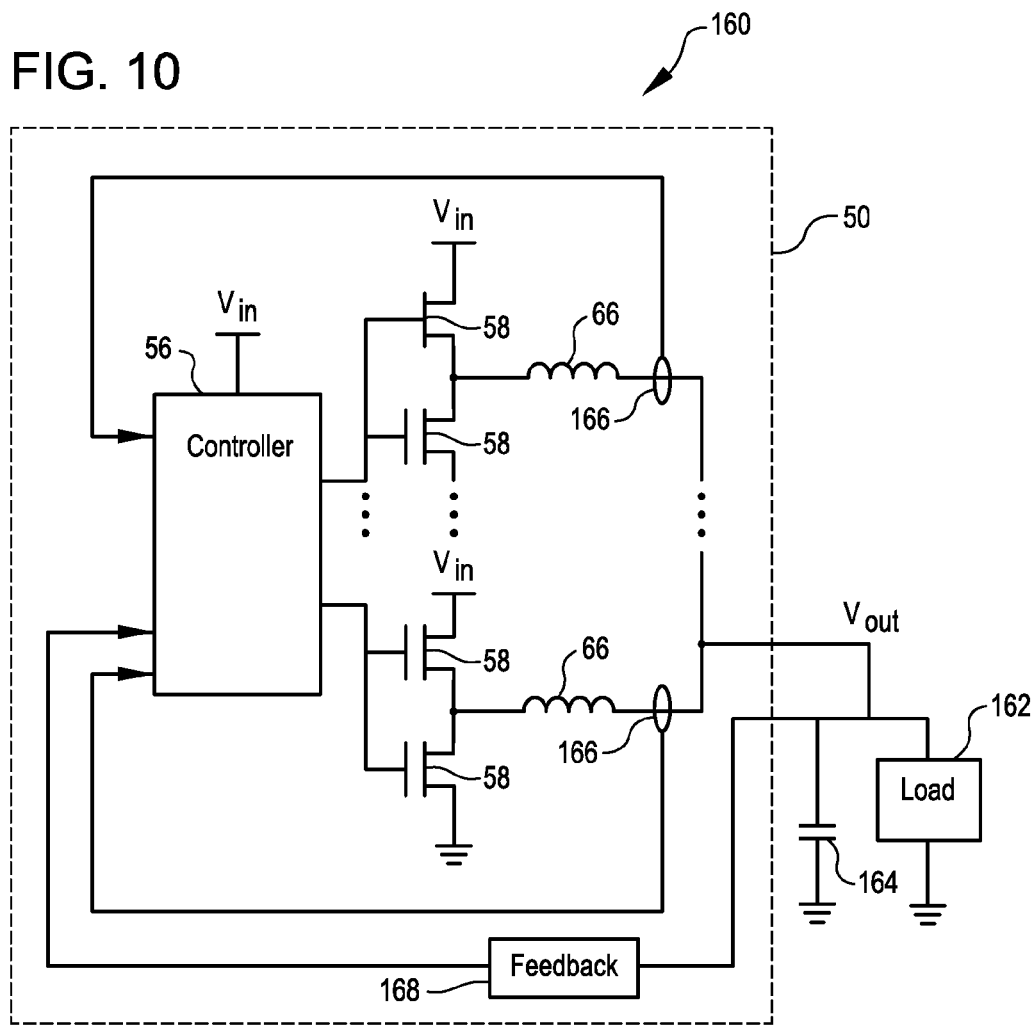
FIG. 10 is a schematic diagram of an embodiment of a system that incorporates one of the power-supply modules of FIGS. 3-7, and 9A-9B.

FIG. 10 is a schematic diagram of an embodiment of a system 160 that may incorporate one or more embodiments of the power-supply modules 50, 90, 100, and 130 of FIGS. 3-7 and 9A-9B. For purposes of explanation, however, the system 160 is discussed as incorporating an embodiment of the module 50 of FIG. 3, where the module 50 includes a buck converter.

In addition to the module 50, the system 160 includes a load 162 that receives a regulated voltage Vout from the module, and a filter capacitor C 164. Examples of the load 162 include an integrated circuit such as a processor or memory.

Furthermore, the module 50 may include phase current sensors 166 and a feedback circuit 168; the current sensors and feedback circuit may be constructed, at least in part, from the R/C components 64 of FIG. 3.

In operation, the controller 56 controls the transistors 58 in response to the current sensors 164 and feedback circuit 166 to alternately couple an input voltage Vin to the phase inductors 66 in a manner that generates the regulated voltage Vout from Vin. The current sensors 164 may allow the controller 56 to balance the load current among the phases (each phase may include a respective hi-lo pair of the transistors 58 and a respective phase inductor 64), and may also allow the controller to detect and limit an over current to the load (for example, if the load is short circuited).

Still referring to FIG. 10, alternate embodiments of the system 160 are contemplated. For example, any of the alternate embodiments described above in conjunction with FIGS. 3-9B may be applicable to the system 160. Furthermore, although described as a buck converter, the module 50 may include any other type of power supply such as a buck-boost converter. Moreover, the module 50 may include additional components such as a filter inductor coupled between the phase inductors 66 and the load 162. In addition, the filter capacitor 164 may be part of the module 50.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:
1. A power-supply module, comprising:
a package having a first side and a second side;
an electromagnetic-interference shield including
a platform disposed adjacent to the first side of the package, and
a first lead frame disposed adjacent to the second side of the package;

a first power-supply component electrically coupled to one of the platform and the first lead frame; and a second power-supply component electrically coupled to the other of the platform and the first lead frame.

2. The power-supply module of claim 1 wherein the package includes an epoxy resin.

3. The power-supply module of claim 1 wherein one of the first and second power-supply components includes a controller.

4. The power-supply module of claim 1 wherein one of the first and second power-supply components includes an inductor.

5. The power-supply module of claim 1 wherein one of the first and second power-supply components includes a transistor.

6. The power-supply module of claim 1 wherein one of the first and second power-supply components includes a resistor.

7. The power-supply module of claim 1 wherein one of the first and second power-supply components includes a capacitor.

8. The power supply module of claim 1 wherein the platform includes a circuit board disposed adjacent to the first side of the package.

9. The power-supply module of claim 1,
wherein the platform includes a circuit board disposed adjacent to the first side of the package; and
wherein the first lead frame includes a lead that is disposed inside of the package and that contacts the circuit board.

10. The power-supply module of claim 1,
wherein the platform includes a circuit board disposed adjacent to the first side of the package; and
wherein the first lead frame includes a lead that is disposed inside of the package and that supports the lead frame over the circuit board.

11. The power-supply module of claim 1,
wherein the platform includes a circuit board disposed adjacent to the first side of the package; and
wherein the lead frame includes a lead that is disposed inside of the package and that supports the circuit board over the lead frame.

12. The power-supply module of claim 1, further comprising:
wherein the first lead frame has a portion exposed through the second side of the package; and
a heat sink attached to the exposed portion of the lead frame.

13. A power-supply module, comprising:
a package having a first side and a second side;
a first power-supply component disposed within the package and configured to generate a regulated supply signal; and
an electromagnetic-interference shield including:
a platform disposed adjacent to the first side of the package; and
a first lead frame disposed adjacent to the second side of the package; and
wherein the platform includes a second lead frame disposed adjacent to the first side of the package.

14. The power-supply module of claim 13, further comprising:
wherein the first component is mounted to one of the first and second lead frames; and
a second component mounted to the other of the first and second lead frames.

15. The power-supply module of 13, wherein the second lead frame has a lead that is disposed inside of the package and that contacts the first lead frame.

16. The power-supply module of claim 13 wherein the second lead frame has a lead that is disposed inside of the package and that supports the second lead frame over the first lead frame.

17. The power-supply module of claim 13 wherein the second lead frame has a lead that is disposed inside of the package and that supports the first lead frame over the second lead frame.

18. The power-supply module of claim 1, further comprising:
wherein the platform includes a circuit board disposed adjacent to the first side of the package and having a portion exposed through the side of the package; and
a heat sink attached to the exposed portion of the circuit board.

19. The power-supply module of claim 1, further comprising:
wherein the platform includes a circuit board disposed adjacent to the first side of the package;
wherein one of the first and second components includes a pad and is mounted to the circuit board; and
a clip electrically coupling the pad of the one of the first and second components to the circuit board.

20. The power-supply module of claim 1, further comprising:
wherein one of the first and second components includes a pad and is mounted to the first lead frame; and
a clip electrically coupling the pad of the one of the first and second components to the first lead frame.

21. The power-supply module of claim 1 wherein:
one of the first and second components includes a pad and is mounted to the platform; and
wherein the first lead frame includes a lead that is disposed inside of the package and that contacts the pad of the one of the first and second components.

22. The power-supply module of claim 1, wherein:
the first lead frame is disposed adjacent to a top side of the package and has a lead that extends along the first side of the package to a bottom side of the package and has a first lead portion that is exposed adjacent to the first and bottom sides of the package; and
the platform includes a second lead frame disposed adjacent to the bottom side of the package and having a second lead portion that is exposed adjacent to the first and bottom sides of the package and to the first lead portion.

23. The power-supply module of claim 1 wherein:
the first lead frame is disposed adjacent to a top side of the package and has first and second leads that extends along a first side of the package to a bottom side of the package and has respective first and second lead portions that are exposed adjacent to the first and bottom sides of the package; and
the platform includes a second lead frame disposed adjacent to the bottom side of the package and having third and fourth leads with respective third and fourth lead portions that are exposed adjacent to the first and bottom sides of the package and that extend between the first and second lead portions.

24. A power-supply module, comprising:
a package having a first side and a second side;
an electromagnetic-interference shield including
a platform disposed adjacent to the first side of the package, and a first lead frame disposed adjacent to the second side of the package;
a first power-supply component electrically coupled to one of the platform and the first lead frame;
a second power-supply component electrically coupled to the other of the platform and the first lead frame;
wherein the first lead frame is disposed adjacent to a bottom side of the package and has first and second leads with respective first and second lead portions that are exposed adjacent to first and bottom sides of the package; and
wherein the platform includes a second lead frame disposed adjacent to a top side of the package and having third and fourth leads that extend along the first side of the package to the bottom side of the package and having respective third and fourth lead portions that are exposed adjacent to the first and bottom sides of the package and that extend between the first and second lead portions.

25. The power-supply module of claim 1 wherein the electromagnetic-interference shield is disposed adjacent to only a portion of one of the first and second sides of the package, the portion being less than the entirety of the one side.

26. The power-supply module of claim 1 wherein the electromagnetic-interference shield is disposed adjacent to more than the first and second sides of the package.

27. The power-supply module of claim 1 wherein the electromagnetic-interference shield is disposed adjacent to all sides of the package.

28. The power-supply module of claim 1 wherein the electromagnetic-interference shield further includes a lead of the lead frame disposed adjacent to the second side of the package.

29. A system, comprising:
a power-supply module, including
a package having first and second sides,
an electromagnetic-shield platform disposed adjacent to one of the first and second sides of the package,
an electromagnetic-shield lead frame disposed adjacent to the other of the first and second sides of the package,
a first electronic component electrically coupled to one of the platform and the lead frame,
a second electronic component electrically coupled to the other of the platform and the lead frame, and
a supply output node; and
an integrated circuit coupled to the supply output node.

30. The system of claim 29 wherein the integrated circuit comprises a processor.

31. The system of claim 29 wherein the integrated circuit comprises a memory.

32. A method, comprising:
electrically coupling a first power-supply component to a side of an electromagnetic-interference-shielding platform;
disposing a first lead frame to form an electromagnetic-interference shield adjacent to the side of the platform;
electrically coupling a second power-supply component to a side of the lead frame;
packaging the first and second components, platform, and shield; and
exposing a portion of the lead frame through the package, wherein the exposed portion is configured to be coupled to a heat sink.

33. The method of claim 32 wherein the platform comprises a circuit board.

34. The method of claim 32 wherein the platform comprises a second lead frame.

35. The method of claim 32, further comprising attaching the first component to the platform.

36. The method of claim 32 wherein disposing the lead frame includes disposing the shield approximately perpendicular to the platform.

37. The method of claim 32 wherein packaging includes covering the first and second components, platform, and shield with a packaging material.

38. The method of claim 32 wherein packaging includes disposing epoxy around the first and second components, platform, and shield.

39. The power-supply module of claim 1 wherein the platform and the first lead frame completely cover at least one of the first and second power-supply components.

40. The power-supply module of claim 13 wherein the platform and the first lead frame overlap the entire first power-supply component.

41. The system of claim 29 wherein:
the electromagnetic-shield platform is disposed over one of the first and second electronic components in its entirety and is disposed under the other one of the first and second electronic components in its entirety; and
the electromagnetic-shield lead is disposed over the other one of the first and second electronic components in its entirety and is disposed under the one of the first and second electronic components in its entirety.

42. The method of claim 32 wherein:
electrically coupling the first power-supply component includes electrically coupling the first power-supply component to the side of the electromagnetic-interference-shielding platform such that the electromagnetic-interference-shielding platform completely covers the first power-supply component; and
disposing the first lead frame includes disposing the first lead frame such that the electromagnetic-interference shield completely covers the first power-supply component.

43. The method of claim 42 wherein electrically coupling the second power-supply component includes electrically coupling the second power-supply component to the side of the lead frame such that the electromagnetic-interference-shielding platform and the electromagnetic-interference shield completely cover the second power-supply component.

44. A circuit module, comprising:
a package having a first side and a second side;
an electromagnetic-interference shield including
a platform disposed adjacent to the first side of the package, and
a first lead frame disposed adjacent to the second side of the package;
a first power-supply component electrically coupled to one of the platform and the first lead frame such that the platform and the first lead frame completely overlap the first power-supply component; and
a second power-supply component electrically coupled to the other of the platform and the first lead frame.

45. The circuit module of claim 44 wherein the second power-supply component is electrically coupled to the other of the platform and the first lead frame such that the platform and the first lead frame completely overlap the second power-supply component.

* * * * *